United States Patent [19]

Das

[11] Patent Number: 5,278,431
[45] Date of Patent: Jan. 11, 1994

[54] DIAMOND RECTIFYING CONTACT WITH UNDOPED DIAMOND LAYER

[75] Inventor: Kalyankumar Das, Raleigh, N.C.
[73] Assignee: Kobe Development Corporation, Research Triangle Park, N.C.
[21] Appl. No.: 21,204
[22] Filed: Feb. 23, 1993

Related U.S. Application Data

[63] Continuation-in-part of Ser. No. 896,538, Jun. 9, 1992.
[51] Int. Cl.$^5$ ............... H01L 31/0312; H01L 27/095; H01L 29/48; H01L 23/48
[52] U.S. Cl. ..................... 257/77; 257/471; 257/485; 257/750; 257/764
[58] Field of Search ............. 257/77, 73, 471, 472, 257/476, 486, 485, 750, 764, 768; 437/100

[56] References Cited

U.S. PATENT DOCUMENTS

| | | | |
|---|---|---|---|
| 4,982,243 | 1/1991 | Nakahata | 257/77 |
| 5,132,749 | 7/1992 | Nishibayashi et al. | 257/471 |
| 5,155,559 | 10/1992 | Humphries et al. | 257/77 |
| 5,173,761 | 12/1992 | Dreifus et al. | 257/77 |

FOREIGN PATENT DOCUMENTS

417645A1 3/1991 European Pat. Off. .............. 257/77

OTHER PUBLICATIONS

Geis, "High-Temperature Point-Contact Transistors and Schottky Diodes Formed on Synthetic Boron-Doped Diamond", IEEE Electron Device Letters, vol. EDL-8, No. 8, pp. 341-343, Aug. 1987.
Shiomi et al., "Characterization of Boron-Doped Diamond Epitaxial Films and Applications for High-Voltage Schottky Diodes and MESFET's", New Diamond Science and Technology, 1991 MRS Int. Conf. Proc., pp. 975-980.
Gildenblatt et al., "High Temperature Schottky Diodes with Boron-Doped Homoepitaxial Diamond Base", Mat. Res. Bul., vol. 25, pp. 129-134 (1990).
Miyata et al., "Metal-Insulator-Semiconductor Diodes Using Polycrystalline Diamond Thin Films", presented at the ECS Meeting, Washington, D.C., 1981.
Hewett et al., "Fabrication of an Insulated Gate Diamond FET for High Temperature Applications", presented at the International High Temperature Electronics Conference in Albuquerque, N. Mex., pp. 168-173, Jun. 1991.
Geis, "Diamond Transistor Performance and Fabrication", Proceeding of the IEEE, vol. 79, No. 5, May 1991.
Prins, "Preparation of Ohmic Contacts to Semiconducting Diamond", Schonland Research Centre, University of Witwaterstrand, Johannesburg 2050, South Africa, Jul. 1989, pp. 1562-1564.
Venkatesan et al., "Effect of Thin Interfacial $SiO_2$ Films on Metal Contacts to B-Doped Diamond Films", Journal of the Electrochemical Society, vol. 139, No. 5, May 1992.
Gildenblat et al., "High-Temperature Thin-Film Diamond Field-Effect Transistor Fabricated Using a Selective Growth Method", IEEE Electron Device Letters, vol. 12, No. 2, Feb. 1991.

*Primary Examiner*—William Mintel
*Assistant Examiner*—Steven Loke
*Attorney, Agent, or Firm*—Bell, Seltzer, Park & Gibson

[57] ABSTRACT

A rectifying contact includes a first semiconducting diamond layer, a second undoped diamond layer on the first layer, and a third relatively highly doped diamond layer on the second layer. The first semiconducting diamond layer may be formed on a supporting substrate. A bonding contact is preferably formed on the third relatively highly doped diamond layer for facilitating electrical connection thereto. The bonding contact is preferably a titanium carbide/gold bilayer. In one embodiment, an ohmic contact may be formed on the first semiconducting diamond layer by an electrically conductive substrate and an associated metal layer on an opposite side of the substrate from the semiconducting diamond layer. In another embodiment, an ohmic contact may be formed on the first semiconducting diamond layer by a fourth relatively highly doped diamond layer and an associated bonding contact on the fourth diamond layer. The relatively highly doped diamond layers may be formed by ion implantation, annealing, and an etch of a graphitized surface portion of the implanted diamond layers.

29 Claims, 3 Drawing Sheets

DIAMOND RECTIFYING CONTACT WITH UNDOPED DIAMOND LAYER

RELATED APPLICATION

The present application is a continuation-in-part application of U.S. Application Ser. No. 7/896,538 filed Jun. 9, 1992 "Vertical Diamond Field Effect Transistor and Method for Making Same", pending.

FIELD OF THE INVENTION

The invention relates to the field of semiconductor devices, and, more particularly, to a diamond rectifying contact and associated fabrication method for use in semiconductor devices, such as diodes and transistors.

BACKGROUND OF THE INVENTION

Diamond is a preferred material for semiconductor devices because it has semiconductor properties that are better than traditionally used silicon, germanium, or gallium arsenide. Diamond provides a higher energy band gap, a higher breakdown voltage and a greater saturation velocity than these traditional semiconductor materials. These properties of diamond yield a substantial increase in projected cutoff frequency and maximum operating voltage compared to devices fabricated using conventional semiconductor materials. For example, silicon is typically not used at temperatures higher than about 200° C. and gallium arsenide is not typically used above 300° C. These temperature limitations are caused, in part, because of the relatively small energy band gaps for silicon (1.12 eV at ambient temperature) and gallium arsenide (1.42 eV at ambient temperature). Diamond, in contrast, has a large band gap of 5.47 eV at ambient temperature, and is thermally stable up to about 1400° C.

Diamond has the highest thermal conductivity of any solid at room temperature and exhibits good thermal conductivity over a wide temperature range. The high thermal conductivity of diamond may be advantageously used to remove waste heat from an integrated circuit, particularly as integration densities increase. In addition, diamond has a smaller neutron cross-section which reduces its degradation in radioactive environments. In other words, diamond is also a "radiation-hard" material.

Because of the advantages of diamond as a material for semiconductor devices, there is at present an interest in the growth and use of diamond for high temperature and radiation-hardened electronic devices. Key to many of such devices, such as diodes and field effect transistors (FET's), is a rectifying contact having good rectifying characteristics even at relatively high temperatures. Consequently, the fabrication of rectifying contacts on diamond will play an important role in the development of future diamond-based semiconductor devices.

Rectifying contacts have been successfully obtained on single crystal semiconducting diamond. For example, U.S. Pat. No. 4,982,243 to Nakahata et al. discloses a rectifying contact on a single crystal diamond layer that may be formed by the chemical vapor deposition of refractory metals, such as tungsten, molybdenum, niobium, tantalum, as well as other materials such as aluminum, polycrystalline silicon, nickel, gold, platinum, tungsten carbide, molybdenum carbide, tantalum carbide, niobium carbide, tungsten silicide or molybdenum silicide. Unfortunately, to produce a rectifying contact, a single crystal diamond substrate must be used and a single crystal diamond layer must be homoepitaxially deposited on the substrate. Moreover, the single crystal diamond substrate must have a polished surface which inclines at an angle of not larger than 10° to a (100) plane.

Similarly, European patent application No. 417,645 A1 to Shiomi, entitled MES Field Effect Transistor Formed in a Diamond Layer, discloses a rectifying gate electrode requiring single crystal diamond. The rectifying gate electrode may be gold, platinum, copper, molybdenum, tungsten, aluminum, nickel cobalt, manganese, or carbides thereof. However, a single crystal diamond substrate is relatively expensive and large substrate sizes are not readily available as desirable for many semiconductor applications.

Geis, in an article entitled High-Temperature Point-Contact Transistors and Schottky Diodes Formed on Synthetic Boron-Doped Diamond, IEEE Electron Device Letters, Vol. EDL.-8, No. 8, pp. 341–343, August 1987, discloses a point contact rectifying contact for a transistor on single crystal diamond. Similarly, Shiomi et al. in Characterization of Boron-Doped Diamond Epitaxial Films and Applications for High-Voltage Schottky Diodes and MESFET's, New Diamond Science and Technology, 1991 MRS Int. Conf. Proc., pp. 975–980, discloses a titanium rectifying contact formed on a homoepitaxial diamond film deposited on a (100) surface of a synthesized single crystal type Ib diamond substrate.

U.S. Pat. No. 5,155,559 to Humphries et al. entitled High Temperature Refractory Silicide Rectifying Contact and Method for Making Same, discloses a rectifying contact on either single crystal or polycrystalline diamond. The contact includes a layer of refractory metal silicide. Moreover, a non-abrupt interface region is formed between the metal silicide and diamond by annealing the as-deposited metal silicide. The non-abrupt interface region may thus include silicon carbide, the carbide of the refractory metal, and mixtures thereof.

Surface roughness and grain boundaries provide reverse current leakage paths and degrade contact performance for polycrystalline diamond. Metals deposited onto polycrystalline diamond in an attempt to form a rectifying contact may diffuse into the diamond film through grain boundaries during subsequent high temperature processing or during operation, thereby degrading performance.

While polycrystalline diamond is a preferred material for many semiconductor devices, its surface roughness and grain boundaries have impeded the development of rectifying contacts on polycrystalline diamond. These disadvantages are further highlighted at higher temperatures where diffusion is more likely to occur. Accordingly, the advantages using polycrystalline diamond, such as lower cost and high operating temperatures, have not been realized.

Despite the lesser expense and relative ease of fabricating polycrystalline diamond films as compared to single crystal diamond, attempts to obtain good rectifying characteristics on polycrystalline diamond have had little success. For example, Gildenblatt et al. in an article entitled High Temperature Schottky Diodes with Boron-Doped Homoepitaxial Diamond Base, Mat. Res. Bul., Vol. 25, pp. 129–134 (1990), report attempts to fabricate Schottky contacts using gold and aluminum on polycrystalline diamond, but indicate that such contacts have shown unacceptably high leakage current above 250°-300° C. Accordingly, Gildenblatt et al. teach a homoepitaxial diamond film formed on a single crystal diamond substrate to provide a rectifying contact with a gold electrode layer.

An article by Miyata et al. entitled Metal-Insulator-Semiconductor Diodes Using Polycrystalline Diamond Thin Films, presented at the ECS Meeting in Washington, D.C., in 1991, discloses that improved rectification of a diamond rectifying contact was obtained by providing an undoped diamond layer between a semiconducting diamond layer and an aluminum layer.

SUMMARY OF THE INVENTION

In view of the foregoing background, it is therefore an object of the present invention to provide a rectifying contact and associated fabrication method therefor including diamond and operable at high temperatures.

This and other objects, advantages, and features of the invention are provided by a rectifying contact including a first semiconducting diamond layer, a second undoped diamond layer on the first diamond layer, and a third relatively highly doped diamond layer on the second diamond layer. Thus, the rectifying contact includes all diamond for high temperature performance up to the range of about 400°-500° C. and beyond.

The first semiconducting diamond layer desirably has a dopant level in the range of about $10^{16}$-$10^{19}$ cm$^{-3}$. As would be readily understood by those skilled in the art the second undoped diamond layer is an insulator. In addition, the second undoped diamond layer has a preferred thickness in a range of about 20-5000 Å, and more preferably, about 20-200 Å.

As would also be readily understood by those skilled in the art, the third layer may preferably be p-doped with boron to be a degenerate semiconductor, that is, where the Fermi level approaches the valence band edge for energies within a few kT units. For diamond, the corresponding dopant threshold is about $1.78 \times 10^{19}$ cm$^{-3}$. More preferably, the third relatively highly doped diamond layer has a dopant level in the range of about $10^{20}$-$10^{21}$ cm$^{-3}$.

The rectifying contact also preferably includes a bonding contact on the third relatively highly doped diamond layer for facilitating electrical connection thereto. The bonding contact preferably includes a refractory metal carbide layer on the third relatively highly doped diamond layer, and an electrically conductive passivating layer on the outer surface of the refractory metal carbide layer opposite the third diamond layer. The refractory metal carbide layer is preferably titanium carbide, and the passivating layer is preferably gold. The bonding contact may also include a refractory metal layer and a passivating layer, or, alternately, the bonding contact may be a single layer of gold or aluminum.

The first, second and third diamond layers may either all be polycrystalline diamond, or all single crystal diamond, or combinations of single and polycrystalline diamond. In addition, each of the diamond layers may preferably be optically transmissive for permitting optoelectronic applications. To enhance the optically transmissive property of the diamond layers when polycrystalline diamond is used, for example, the surfaces of each layer may be polished.

The rectifying contact may be incorporated into another semiconductor device, such as an FET, diode, thyristor, etc. The rectifying contact may also include a supporting substrate, such as a silicon substrate, on which the first semiconducting diamond layer is formed. In one embodiment of the rectifying contact, the substrate may be electrically conducting and includes a metal layer on the back of the substrate to thereby provide an ohmic contact for the rectifying contact.

Another embodiment of the invention includes an ohmic contact on the first semiconducting diamond layer wherein the ohmic contact preferably includes a fourth relatively highly doped diamond layer on the first semiconducting diamond layer. A bonding contact is also preferably provided on the fourth relatively highly doped diamond layer for facilitating connection thereto. As described above, the bonding contact may be provided by a titanium carbide/gold bilayer.

A method for making a rectifying contact according to the invention includes the steps of forming a first semiconducting diamond layer, forming a second undoped diamond layer on the first semiconducting diamond layer, and forming a third relatively highly doped diamond layer on the second undoped diamond layer. The step of forming the third relatively highly doped diamond layer preferably includes ion implanting an outer portion of the second undoped diamond layer, annealing the thus formed structure to form a graphitized surface portion from the ion implanted portion, and etching away the graphitized surface portion thereby exposing a relatively highly doped diamond layer.

A bonding contact may also be formed on the third relatively highly doped diamond layer for facilitating electrical connection thereto. As an alternative, the first, second and third diamond layers may be individually deposited by conventional plasma enhanced chemical vapor deposition, for example.

An ohmic contact on the first semiconductor diamond layer may be provided by forming the first diamond layer on an electrically conductive substrate, and forming a metal layer on the backside of the substrate. Alternately, an ohmic contact may also be formed on the first semiconducting diamond layer, such as by forming a fourth relatively highly doped diamond layer and an associated bonding contact on the fourth diamond layer.

DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements in alternate embodiments throughout. The thickness of layers and regions are exaggerated for clarity.

Figure 1:
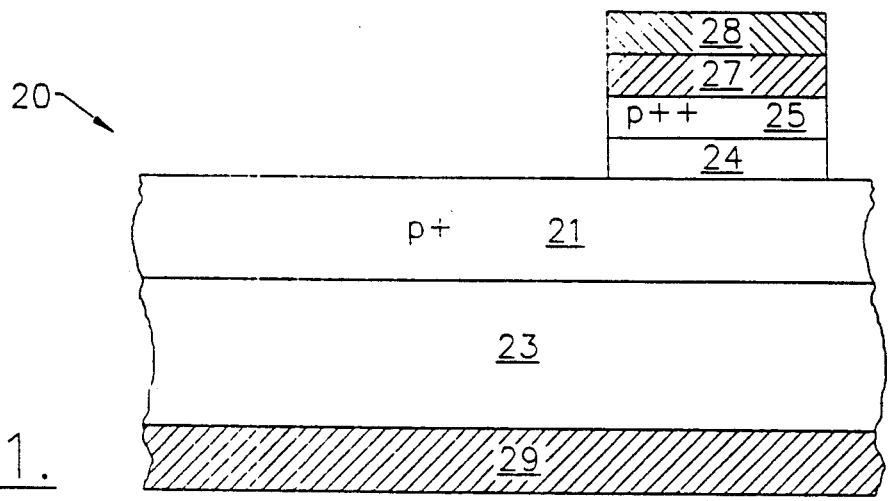
FIG. 1 is a cross-sectional side view of a first embodiment of a rectifying contact according to the invention.

Referring to FIG. 1, there is shown a first embodiment of a rectifying contact 20 according to the invention. The rectifying contact 20 includes a first semiconducting diamond layer (p+) 21 formed on a suitable substrate 23, such as silicon, such as by conventional plasma enhanced chemical vapor deposition, as would be readily understood by those having skill in the art. The first semiconducting diamond layer 21 is preferably p-type and doped with boron to a dopant level in the range of about $10^{16}$–$10^{19}$ cm$^{-3}$.

A second undoped, or insulating, diamond layer 24 is on the upper face of the first diamond layer 21. The second undoped layer preferably has a thickness in the range of about 20–5000 Å, and more preferably, about 20–200 Å. The second undoped diamond layer 24 preferably has a dopant concentration of less than about $10^{16}$ cm$^{-3}$. A third relatively highly doped, or electrically conducting, diamond layer (p++) 25 is on the second layer 24. The third diamond layer 25 is preferably p-doped to be a degenerate semiconductor, that is, doped to at least $10^{19}$ cm$^{-3}$, and more preferably has a dopant level in the range of about $10^{20}$–$10^{21}$ cm$^{-3}$. As would be readily understood by those skilled in the art, the p-type dopant is also preferably boron.

A bonding contact is on the third relatively highly doped diamond layer 25 for facilitating electrical connection thereto. The bonding contact preferably includes a sputter deposited refractory metal carbide layer 27 on the third relatively highly doped diamond layer 25, and an electrically conductive passivating layer 28 on the refractory metal carbide layer opposite the third diamond layer. As would be readily understood by those skilled in the art, the refractory metal carbide layer 27 may also be formed by other conventional deposition techniques.

The refractory metal carbide layer 27 is preferably titanium carbide having a thickness in the range of about 200–400 Å. The passivating layer 28 is preferably gold having a thickness of about 1000–1500 Å, and more preferably, about 200–400 Å. In other words, a titanium carbide/gold bilayer preferably provides the bonding contact for the rectifying contact 20. Alternately, in place of a refractory metal carbide layer 27 a refractory metal layer may be deposited; however, the refractory metal layer may require an annealing operation unlike the refractory metal carbide layer 27. As would be readily understood by those skilled in the art, for certain applications, a single layer of gold or aluminum, for example, may also be used to provide the bonding contact.

In the illustrated embodiment of FIG. 1, an ohmic, or back contact for the rectifying contact is provided by an electrically conducting substrate 23, such as highly-doped silicon, and a metal layer 29 on the substrate for facilitating electrical connection thereto. This embodiment of the rectifying contact 20 according to the invention may advantageously be used in a discrete semiconductor device, such as a high power diode, for example. As would be readily understood by those skilled in the art, the rectifying contact 20 may be used in other semiconductor devices, as well.

Figure 2:
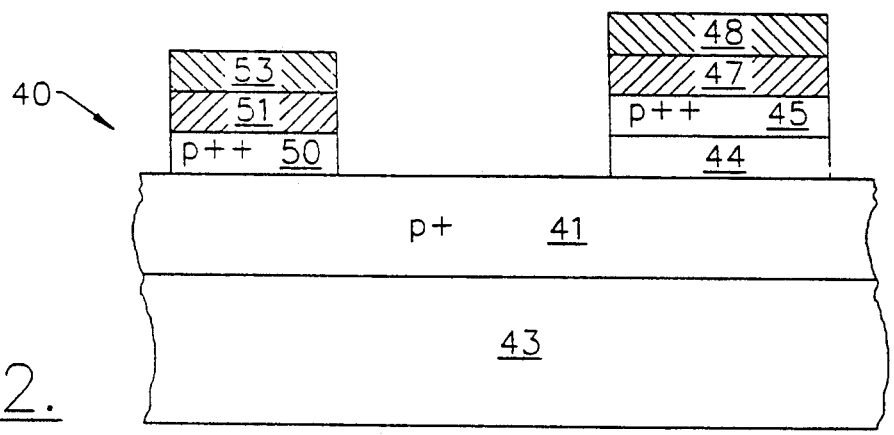
FIG. 2 is a cross-sectional side view of a second embodiment of a rectifying contact according to the invention.

Referring now to FIG. 2, a second embodiment of the rectifying contact 40 according to the invention is shown. This embodiment includes a first semiconducting diamond layer (p+) 41, a second undoped diamond layer 44 on the first layer, a third relatively highly doped diamond layer (p++) 45 on the second layer, and a bonding contact provided by a titanium carbide layer 47 and a gold passivating layer 48. The rectifying contact 40 also preferably includes a supporting substrate 43. The preferred thicknesses and dopant levels for the layers is as described above with respect to the first illustrated embodiment of the invention.

In the second illustrated embodiment, an ohmic contact is provided on the first semiconducting diamond layer 41 by a fourth relatively highly doped diamond layer 50 preferably on an upper surface of the first diamond layer. A bonding contact is on the fourth relatively highly doped diamond layer 50. The bonding contact is preferably also provided by a titanium carbide/gold bilayer 51,53.

Figure 3:
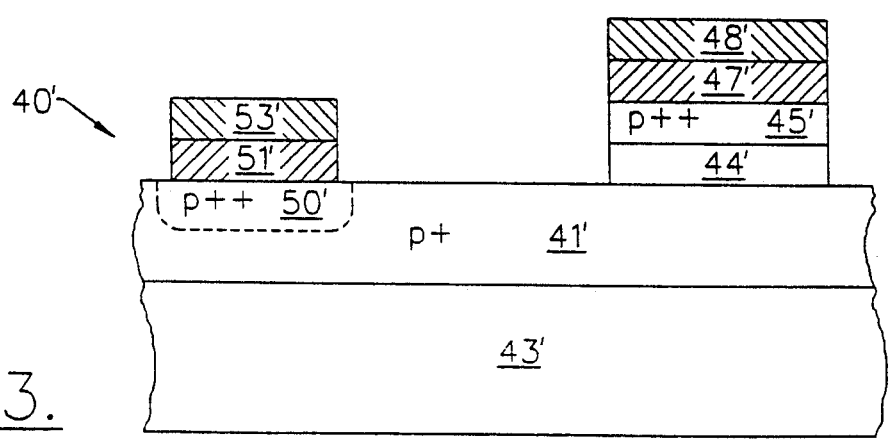
FIG. 3 is a cross-sectional side view of a third embodiment of a rectifying contact according to the invention.
Figure 4:
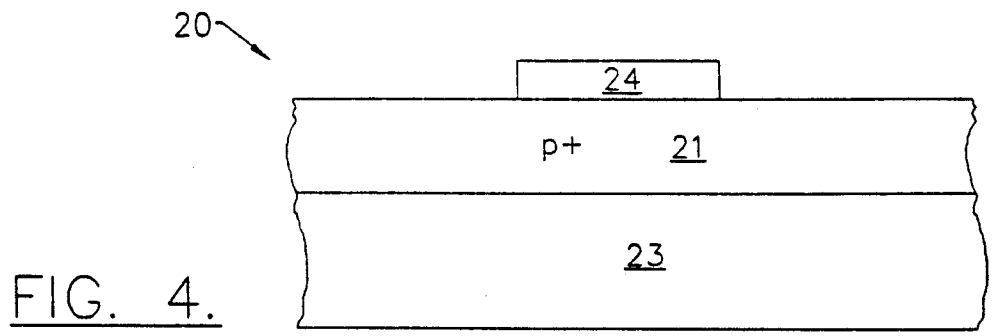
FIGS. 4-7 are side cross-sectional views of intermediate structures illustrating a method for making the embodiment of the rectifying contact as shown in FIG. 1.

FIG. 3 illustrates yet a third embodiment of the invention similar to the embodiment shown in FIG. 2. In FIG. 3, the fourth relatively highly doped diamond layer 50' of the ohmic contact is formed in an outer surface portion of the first semiconducting diamond layer 41', as is described below in greater detail with respect to the method of the present invention. Other elements of the third embodiment of the rectifying contact 40' are similar to those in FIG. 2 and, hence, need not be further described herein.

For all of the embodiments of the rectifying contact 20, 40 and 40' discussed above, the respective diamond layers may all be either single crystal diamond or all polycrystalline diamond, or combinations thereof. For polycrystalline diamond, a nondiamond substrate, such as silicon may be used. For single crystal diamond, a substrate having a relatively close lattice match to diamond, such as single crystal nickel or copper or alloys thereof, may be used. Also, for single crystal diamond layers, a single crystal diamond substrate may be used.

Each of the diamond layers is also preferably optically transmissive for permitting optoelectronic applications. To enhance the optically transmissive property of the diamond layers, when polycrystalline diamond is used, for example, the surfaces of each layer may be polished.

As would be readily understood by those skilled in the art, the rectifying contact 20, 40 and 40' according to the present invention may be used in a variety of semiconductor devices, such as diodes and FET's, for example.

Referring now to FIGS. 4–7, a method for making an embodiment of the rectifying contact 20 as shown in FIG. 1 is explained. A first semiconducting diamond layer 21 may be formed on a suitable substrate, such as by plasma enhanced chemical vapor deposition and in situ doping or ion implantation. Alternately, an upper portion of a diamond substrate 23 may be doped to form the first semiconducting diamond layer 21. The first diamond layer preferably has a dopant level in the range of about $10^{16}$–$10^{19}$ cm$^{-3}$. A second undoped diamond layer 24 is then formed on an upper face of the first diamond layer 21 producing the structure shown in FIG. 4.

Figure 5:
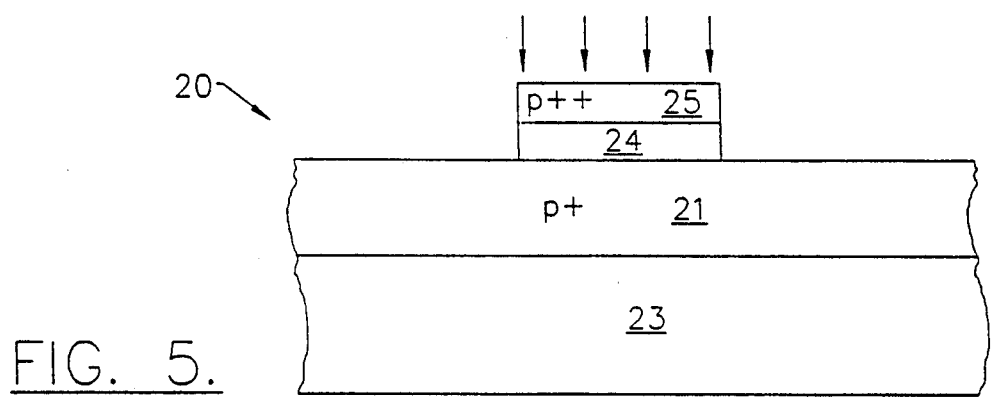
Figure 6:
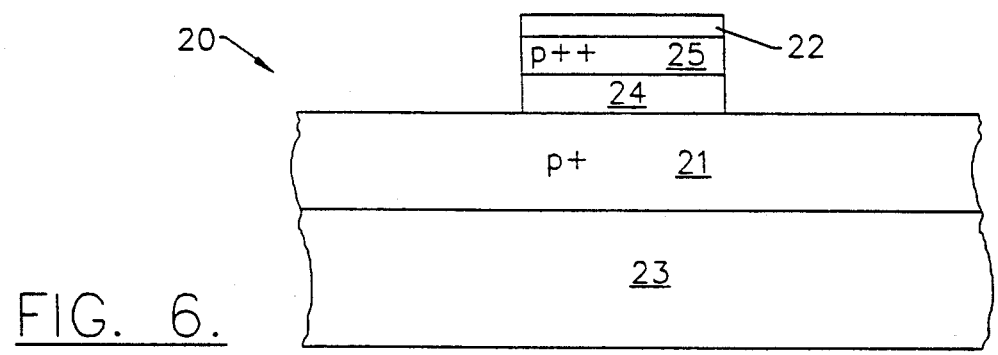
Figure 7:
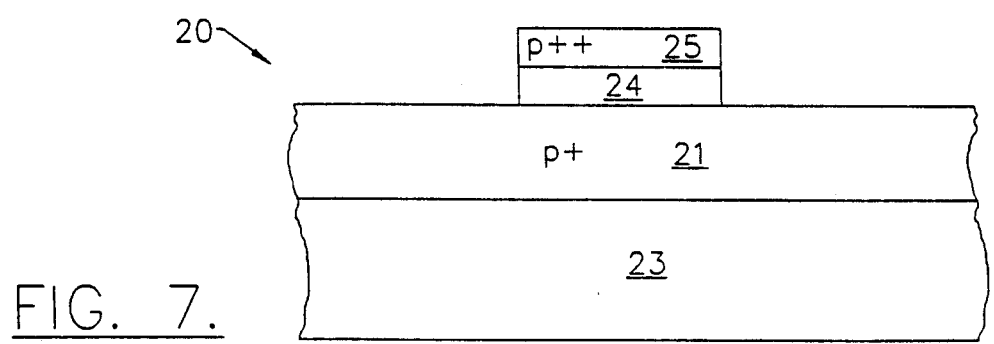

As shown in FIG. 5, a selective ion implantation may be used to form the third relatively highly doped diamond layer 25 from an upper portion of the second undoped diamond layer 24. A subsequent anneal at a temperature of about 1200° C. is performed to form a graphitized surface portion 22 of the ion implanted relatively highly doped diamond layer 25 (FIG. 6). The graphitized surface portion 22 may then be removed by a treating the structure with a hot $CrO_3+H_2SO_4$ solution to etch away the graphitized surface portion 22. Accordingly, a portion of the implanted boron profile is retained in the diamond, thus producing the third relatively highly doped diamond layer 25 as shown in FIG. 7. The metal layers 27, 28 of the bonding contact, and the back metal layer 29 may then be deposited by conventional techniques to form the embodiment of the rectifying contact 20 as shown in FIG. 1.

Those of skill in the art will readily understand that the steps described above with respect to making the embodiment of the rectifying contact as shown in FIG. 1, may also be advantageously used to form the embodiment of the rectifying contact 40 shown in FIG. 2. As would also be readily be understood by those skilled in the art, an alternative method for making the third relatively highly doped diamond layer 25 (FIG. 1), or the third and fourth relatively highly doped layers, 45 and 50, respectively (FIG. 2) is to deposit individual relatively highly doped diamond layer(s).

Figure 8:
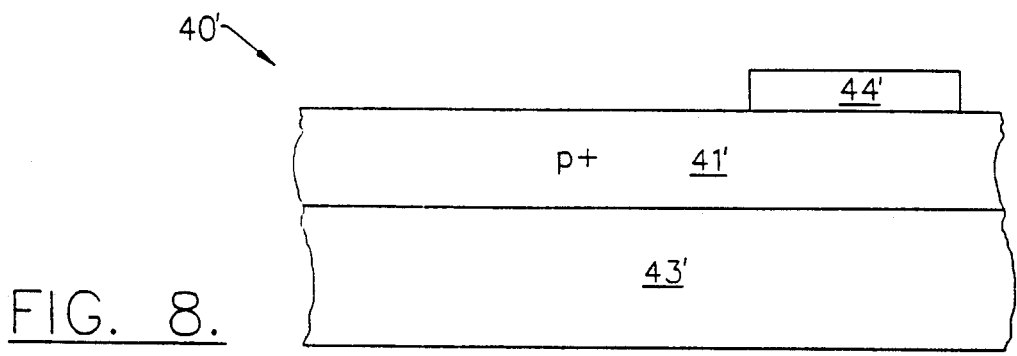
FIGS. 8-11 are side cross-sectional views of intermediate structures illustrating a method for making the embodiment of the rectifying contact as shown in FIG. 3.
Figure 9:
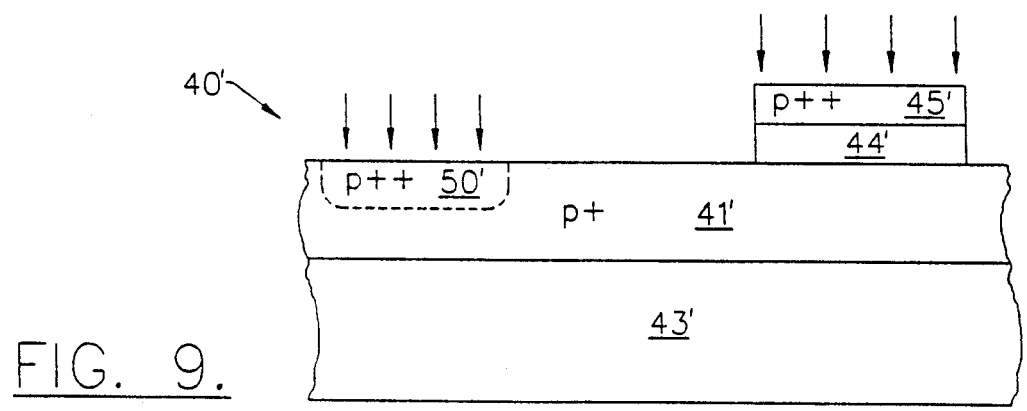
Figure 10:
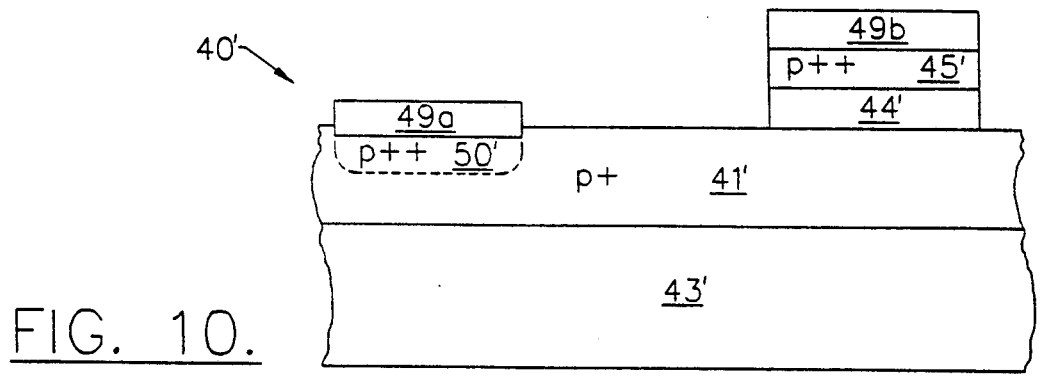

Referring now to FIGS. 8–11, a method for making the third embodiment of the rectifying contact 40' shown in FIG. 3 is explained. As shown in FIG. 8, a first semiconducting diamond layer 41' is preferably formed on a suitable substrate 43', and a second undoped diamond layer 44' is formed on the first diamond layer. Two areas of the thus formed structure may then be selectively ion implanted as shown in FIG. 9, to thereby produce respective relatively highly doped third and fourth diamond layers 45', 50' as illustrated. The fourth relatively highly doped diamond layer 50' is formed in an upper surface portion of the first semiconducting diamond layer 41' laterally adjacent the second undoped diamond layer 44'.

Figure 11:
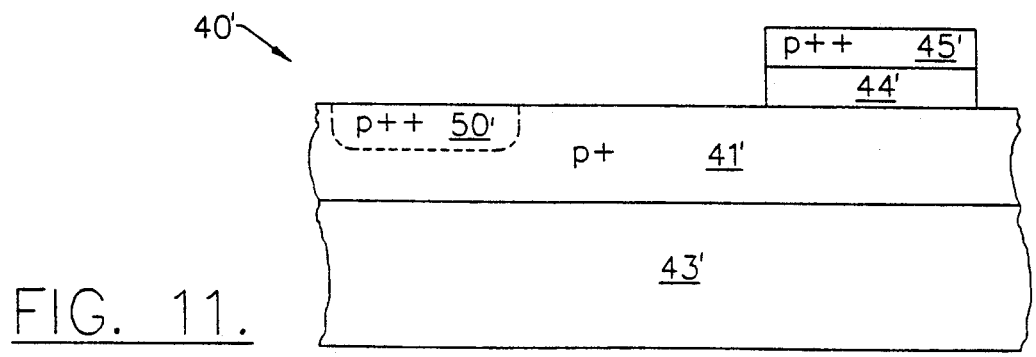

A high temperature anneal of the structure produces graphitized surface portions or layers 49a, 49b (FIG. 10) which may then be removed by a hot chemical etch, as described above. Accordingly, the third and fourth relatively highly doped diamond layers 45', 50' are formed to produce the intermediate structure as shown in FIG. 11. Respective titanium carbide/gold bilayers may then be deposited to produce the rectifying contact as shown in FIG. 3.

The embodiments of the rectifying contact are thus all-diamond, and, accordingly, will have a high degree of thermal stability and maintain good rectifying properties at high temperatures of up to about 500° C. or more. The all diamond structure can also provide a transparent rectifying contact that is potentially applicable for optoelectronic devices, high power discrete diodes or other applications.

One skilled in the art would readily appreciate other semiconductor devices incorporating the embodiments of the rectifying contact according to the invention. Accordingly, many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A rectifying contact comprising:
   a first semiconducting diamond layer;
   a second undoped diamond layer on said first semiconducting diamond layer; and
   a third relatively highly doped diamond layer on said second undoped diamond layer.

2. A rectifying contact according to claim 1 further comprising a bonding contact on said third relatively highly doped diamond layer for facilitating electrical connection thereto.

3. A rectifying contact according to claim 2 wherein said bonding contact comprises a refractory metal carbide layer on said third relatively highly doped diamond layer, and an electrically conductive passivating layer on said refractory metal carbide layer opposite said third relatively highly doped diamond layer.

4. A rectifying contact according to claim 1 wherein said first semiconducting diamond layer has a dopant level in the range of about $10^{16}$–$10^{19}$ cm$^{-3}$.

5. A rectifying contact according to claim 1 wherein said second undoped diamond layer has a thickness in a range of about 20–5000 Å.

6. A rectifying contact according to claim 1 wherein said third relatively highly doped diamond layer has a dopant level greater than about $10^{19}$ cm$^{-3}$.

7. A rectifying contact according to claim 1 wherein said third relatively highly doped diamond layer has a dopant level in the range of about $10^{20}$–$10^{21}$ cm$^{-3}$.

8. A rectifying contact according to claim 1 wherein each of said first, second and third diamond layers comprises polycrystalline diamond.

9. A rectifying contact according to claim 1 wherein each of said first, second and third diamond layers comprises single crystal diamond.

10. A rectifying contact according to claim 1 wherein each of said first, second and third diamond layers is optically transmissive.

11. A rectifying contact according to claim 1 further comprising a substrate on said first semiconducting diamond layer opposite said second undoped diamond layer.

12. A rectifying contact according to claim 11 wherein said substrate comprises silicon.

13. A rectifying contact comprising:
   a first semiconducting diamond layer;
   a second undoped diamond layer on said first semiconducting diamond layer;
   a third relatively highly doped diamond layer on said second undoped diamond layer opposite said first semiconducting diamond layer; and
   an ohmic contact on said first semiconducting diamond layer.

14. A rectifying contact according to claim 13 wherein said ohmic contact comprises an electrically conductive substrate on said first semiconducting diamond layer opposite said second undoped diamond layer.

15. A rectifying contact according to claim 14 wherein said ohmic contact further comprises a metal layer on said substrate opposite said first semiconducting diamond layer for facilitating electrical connection thereto.

16. A rectifying contact according to claim 14 wherein said substrate comprises silicon.

17. A rectifying contact according to claim 13 wherein said ohmic contact comprises a fourth relatively highly doped diamond layer on said first semiconducting diamond layer.

18. A rectifying contact according to claim 17 wherein said ohmic contact further comprises a bonding contact on said fourth relatively highly doped diamond layer for facilitating connection thereto.

19. A rectifying contact according to claim 18 wherein said bonding contact comprises a refractory metal carbide layer on said fourth relatively highly doped diamond layer, and an electrically conductive passivating layer on said refractory metal carbide layer opposite said fourth relatively highly doped diamond layer.

20. A rectifying contact according to claim 17 wherein each of said third and fourth relatively highly doped diamond layers has a dopant level greater than about $10^{19}$ cm$^{-3}$.

21. A rectifying contact according to claim 17 wherein each of said third and fourth relatively highly doped diamond layers has a dopant level in the range of about $10^{20}$–$10^{21}$ cm$^{-3}$.

22. A rectifying contact according to claim 13 wherein said first semiconducting diamond layer has a dopant level in the range of about $10^{16}$–$10^{19}$ cm$^{-3}$.

23. A rectifying contact according to claim 13 wherein said second undoped diamond layer has a thickness in a range of about 20–5000 Å.

24. A rectifying contact according to claim 13 further comprising a bonding contact on said third relatively highly doped diamond layer for facilitating electrical connection thereto.

25. A rectifying contact according to claim 24 wherein said bonding contact comprises a refractory metal carbide layer on said third relatively highly doped diamond layer, and an electrically conductive passivating layer on said refractory metal carbide layer opposite said third relatively highly doped diamond layer.

26. A rectifying contact according to claim 13 wherein each of said first, second and third diamond layers comprises polycrystalline diamond.

27. A rectifying contact according to claim 13 wherein each of said first, second and third diamond layers comprises single crystal diamond.

28. A rectifying contact according to claim 13 wherein each of said first, second and third diamond layers is optically transmissive.

29. A rectifying contact according to claim 13 further comprising a substrate on said first semiconducting diamond layer opposite said second undoped diamond layer.

* * * * *